United States Patent
Choi et al.

(10) Patent No.: US 7,741,144 B2
(45) Date of Patent: Jun. 22, 2010

(54) PLASMA TREATMENT BETWEEN DEPOSITION PROCESSES

(75) Inventors: Soo Young Choi, Fremont, CA (US); Yong-Kee Chae, Pleasanton, CA (US); Shuran Sheng, Santa Clara, CA (US); Liwei Li, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/263,253

(22) Filed: Oct. 31, 2008

(65) Prior Publication Data

US 2009/0142878 A1     Jun. 4, 2009

Related U.S. Application Data

(60) Provisional application No. 60/985,194, filed on Nov. 2, 2007.

(51) Int. Cl.
*H01L 27/142* (2006.01)
(52) U.S. Cl. .............. 438/57; 438/63; 438/96; 438/482; 257/E31.045; 257/E31.048; 257/E27.125; 257/E25.007; 136/250
(58) Field of Classification Search .......... 438/96, 438/482, 57, 63, 76; 257/E31.045, E31.048, 257/E27.125, E25.007; 136/250
See application file for complete search history.

(56) References Cited

U.S. PATENT DOCUMENTS

| | | | |
|---|---|---|---|
| 4,063,735 A | 12/1977 | Wendel | |
| 4,068,043 A | 1/1978 | Carr | |
| 4,271,328 A | 6/1981 | Hamakawa et al. | |
| 4,272,641 A | 6/1981 | Hanak | |
| 4,315,096 A | 2/1982 | Tyan et al. | |
| 4,400,577 A | 8/1983 | Spear | |
| 4,471,155 A | 9/1984 | Mohr et al. | |
| 4,476,346 A | 10/1984 | Tawada et al. | |
| 4,490,573 A | 12/1984 | Gibbons | |
| 4,514,579 A | 4/1985 | Hanak | |
| 4,571,448 A | 2/1986 | Barnett | |
| 4,591,892 A | 5/1986 | Yamazaki | |
| 4,633,034 A | 12/1986 | Nath et al. | |
| 4,667,058 A | 5/1987 | Catalano et al. | |
| 4,690,717 A | 9/1987 | Yamazaki | |

(Continued)

FOREIGN PATENT DOCUMENTS

EP     0589049     1/2000

(Continued)

OTHER PUBLICATIONS

International Search Report dated Jan. 23, 2009, International Application No. PCT/US08/82135.

(Continued)

*Primary Examiner*—George Fourson
(74) *Attorney, Agent, or Firm*—Patterson & Sheridan, LLP (57) ABSTRACT

Embodiments of the present invention include an improved method of forming a thin film solar cell device using a plasma processing treatment between two or more deposition steps. Embodiments of the invention also generally provide a method and apparatus for forming the same. The present invention may be used to advantage to form other single junction, tandem junction, or multi-junction solar cell devices.

15 Claims, 6 Drawing Sheets

U.S. PATENT DOCUMENTS

| | | | |
|---|---|---|---|
| 4,728,370 A | 3/1988 | Ishii et al. | |
| 4,737,196 A | 4/1988 | Yukimoto | |
| 4,755,475 A | 7/1988 | Kiyama et al. | |
| 4,776,894 A | 10/1988 | Watanabe et al. | |
| 4,781,765 A | 11/1988 | Watanabe et al. | |
| 4,841,908 A | 6/1989 | Jacobson et al. | |
| 4,878,097 A | 10/1989 | Yamazaki et al. | |
| 4,891,330 A | 1/1990 | Guha et al. | |
| 4,907,052 A | 3/1990 | Takada et al. | |
| 4,948,436 A | 8/1990 | Juergens | |
| 4,954,856 A | 9/1990 | Yamazaki | |
| 5,009,719 A | 4/1991 | Yoshida | |
| 5,015,838 A | 5/1991 | Yamagishi et al. | |
| 5,021,100 A | 6/1991 | Ishihara et al. | |
| 5,032,884 A | 7/1991 | Yamagishi et al. | |
| 5,204,272 A * | 4/1993 | Guha et al. | 438/96 |
| 5,246,506 A * | 9/1993 | Arya et al. | 136/249 |
| 5,252,142 A | 10/1993 | Matsuyama et al. | |
| 5,256,887 A | 10/1993 | Yang | |
| 5,278,015 A | 1/1994 | Iwamoto et al. | |
| 5,324,365 A | 6/1994 | Niwa | |
| 5,403,404 A | 4/1995 | Arya et al. | |
| 5,453,135 A | 9/1995 | Nakagawa et al. | |
| 5,469,300 A | 11/1995 | Nomura | |
| 5,589,007 A * | 12/1996 | Fujioka et al. | 136/249 |
| 5,620,530 A | 4/1997 | Nakayama | |
| 5,667,597 A | 9/1997 | Ishihara | |
| 5,677,236 A | 10/1997 | Saitoh et al. | |
| 5,700,467 A | 12/1997 | Shima et al. | |
| 5,719,076 A * | 2/1998 | Guha | 438/96 |
| 5,720,826 A | 2/1998 | Hayashi et al. | |
| 5,730,808 A * | 3/1998 | Yang et al. | 136/249 |
| 5,738,732 A | 4/1998 | Nakamura et al. | |
| 5,739,043 A | 4/1998 | Yamamoto | |
| 5,788,447 A | 8/1998 | Yonemitsu et al. | |
| 5,797,998 A | 8/1998 | Wenham et al. | |
| 5,828,117 A | 10/1998 | Kondo et al. | |
| 5,853,498 A | 12/1998 | Beneking et al. | |
| 5,911,839 A | 6/1999 | Tsai et al. | |
| 5,913,986 A | 6/1999 | Matsuyama | |
| 5,927,994 A | 7/1999 | Kohda et al. | |
| 5,942,049 A | 8/1999 | Li et al. | |
| 5,942,050 A | 8/1999 | Green et al. | |
| 5,977,476 A | 11/1999 | Guha et al. | |
| 6,077,722 A * | 6/2000 | Jansen et al. | 438/74 |
| 6,078,059 A | 6/2000 | Nakata | |
| 6,100,466 A | 8/2000 | Nishimoto | |
| 6,111,189 A * | 8/2000 | Garvison et al. | 136/244 |
| 6,121,541 A * | 9/2000 | Arya | 136/255 |
| 6,168,968 B1 | 1/2001 | Umemoto et al. | |
| 6,180,870 B1 | 1/2001 | Sano et al. | |
| 6,190,932 B1 | 2/2001 | Yoshimi et al. | |
| 6,200,825 B1 * | 3/2001 | Yoshimi et al. | 438/24 |
| 6,211,454 B1 | 4/2001 | Sano | |
| 6,222,115 B1 | 4/2001 | Nakanishi | |
| 6,242,686 B1 | 6/2001 | Kishimoto et al. | |
| 6,265,288 B1 | 7/2001 | Okamoto et al. | |
| 6,268,233 B1 * | 7/2001 | Sano | 438/57 |
| 6,274,804 B1 | 8/2001 | Psyk et al. | |
| 6,281,426 B1 | 8/2001 | Olson et al. | |
| 6,281,561 B1 | 8/2001 | Stiebig et al. | |
| 6,288,325 B1 * | 9/2001 | Jansen et al. | 136/249 |
| 6,297,443 B1 | 10/2001 | Nakajima et al. | |
| 6,307,146 B1 | 10/2001 | Takeuchi et al. | |
| 6,309,906 B1 | 10/2001 | Meier et al. | |
| 6,326,304 B1 | 12/2001 | Yoshimi et al. | |
| 6,337,224 B1 | 1/2002 | Okamoto et al. | |
| 6,368,892 B1 * | 4/2002 | Arya | 438/96 |
| 6,380,480 B1 | 4/2002 | Norimatsu et al. | |
| 6,399,873 B1 * | 6/2002 | Sano et al. | 136/249 |
| 6,444,277 B1 | 9/2002 | Law et al. | |
| 6,459,034 B2 | 10/2002 | Muramoto et al. | |
| 6,506,622 B1 | 1/2003 | Shiozaki | |
| 6,521,826 B2 | 2/2003 | Wada | |
| 6,566,159 B2 * | 5/2003 | Sawada et al. | 438/57 |
| 6,587,263 B1 | 7/2003 | Iacovangelo et al. | |
| 6,602,606 B1 | 8/2003 | Fujisawa et al. | |
| 6,632,993 B2 | 10/2003 | Hayashi et al. | |
| 6,634,572 B1 | 10/2003 | Burgener | |
| 6,645,573 B2 | 11/2003 | Higashikawa et al. | |
| 6,660,931 B2 | 12/2003 | Toyama et al. | |
| 6,670,543 B2 * | 12/2003 | Lohmeyer et al. | 136/258 |
| 6,750,394 B2 | 6/2004 | Yamamoto et al. | |
| 6,759,645 B2 | 7/2004 | Tawada et al. | |
| 6,777,610 B2 | 8/2004 | Yamada et al. | |
| 6,784,361 B2 * | 8/2004 | Carlson et al. | 136/258 |
| 6,793,733 B2 | 9/2004 | Janakiraman et al. | |
| 6,815,788 B2 | 11/2004 | Oka et al. | |
| 6,825,104 B2 | 11/2004 | Horzel et al. | |
| 6,825,408 B2 | 11/2004 | Nagano et al. | |
| 6,850,991 B1 | 2/2005 | Young et al. | |
| 6,887,728 B2 | 5/2005 | Miller et al. | |
| 6,960,718 B2 | 11/2005 | Sano et al. | |
| 6,963,120 B2 | 11/2005 | Shiozaki et al. | |
| 6,979,589 B2 | 12/2005 | Kishimoto et al. | |
| 6,989,553 B2 | 1/2006 | Yokogawa et al. | |
| 7,001,460 B2 | 2/2006 | Saito et al. | |
| 7,030,313 B2 | 4/2006 | Inamasu et al. | |
| 7,032,536 B2 | 4/2006 | Fukuoka et al. | |
| 7,064,263 B2 | 6/2006 | Sano et al. | |
| 7,071,018 B2 | 7/2006 | Mason et al. | |
| 7,074,641 B2 | 7/2006 | Kondo et al. | |
| 7,235,810 B1 | 6/2007 | Yamazaki et al. | |
| 7,238,545 B2 | 7/2007 | Yoshimi et al. | |
| 7,256,140 B2 | 8/2007 | Call et al. | |
| 7,301,215 B2 | 11/2007 | Kariya | |
| 7,309,832 B2 | 12/2007 | Friedman et al. | |
| 7,332,226 B2 | 2/2008 | Fujisawa, et al. | |
| 7,351,993 B2 | 4/2008 | Atanackovic | |
| 7,375,378 B2 | 5/2008 | Manivannan et al. | |
| 7,560,750 B2 | 7/2009 | Nira et al. | |
| 7,565,880 B2 | 7/2009 | Shimizu et al. | |
| 2001/0035206 A1 | 11/2001 | Inamasu et al. | |
| 2001/0051388 A1 * | 12/2001 | Shiozaki et al. | 438/57 |
| 2001/0055888 A1 | 12/2001 | Madan et al. | |
| 2002/0033191 A1 | 3/2002 | Kondo et al. | |
| 2002/0066478 A1 | 6/2002 | Hayashi et al. | |
| 2003/0013280 A1 | 1/2003 | Yamanaka | |
| 2003/0041894 A1 | 3/2003 | Sverdrup et al. | |
| 2003/0044539 A1 | 3/2003 | Oswald | |
| 2003/0104664 A1 | 6/2003 | Kondo et al. | |
| 2003/0170402 A1 | 9/2003 | Arai et al. | |
| 2004/0045505 A1 | 3/2004 | Higashikawa et al. | |
| 2004/0082097 A1 | 4/2004 | Lohmeyer et al. | |
| 2004/0113287 A1 | 6/2004 | Kishimoto et al. | |
| 2004/0187914 A1 | 9/2004 | Matsuda et al. | |
| 2004/0231590 A1 * | 11/2004 | Ovshinsky | 118/718 |
| 2004/0235286 A1 | 11/2004 | Kroll et al. | |
| 2005/0101160 A1 * | 5/2005 | Garg et al. | 438/795 |
| 2005/0115504 A1 | 6/2005 | Ueda et al. | |
| 2005/0173704 A1 | 8/2005 | Saito et al. | |
| 2005/0181534 A1 | 8/2005 | Yoshimi et al. | |
| 2005/0189012 A1 | 9/2005 | Kondo et al. | |
| 2005/0251990 A1 | 11/2005 | Choi et al. | |
| 2005/0284517 A1 | 12/2005 | Shinohara | |
| 2006/0024442 A1 * | 2/2006 | Ovshinsky | 427/255.5 |
| 2006/0038182 A1 | 2/2006 | Rogers et al. | |
| 2006/0060138 A1 | 3/2006 | Keller et al. | |
| 2006/0134496 A1 | 6/2006 | Won et al. | |
| 2006/0169317 A1 | 8/2006 | Sato et al. | |
| 2006/0240649 A1 | 10/2006 | Roschek et al. | |
| 2006/0249196 A1 | 11/2006 | Shima | |
| 2006/0283496 A1 | 12/2006 | Okamoto et al. | |
| 2007/0000538 A1 | 1/2007 | Shima | |

| | | | |
|---|---|---|---|
| 2007/0039942 | A1 | 2/2007 | Leung et al. |
| 2007/0137698 | A1 | 6/2007 | Wanlass et al. |
| 2007/0151596 | A1 | 7/2007 | Nasuno et al. |
| 2007/0209699 | A1 | 9/2007 | Sichanugrist et al. |
| 2007/0227579 | A1 | 10/2007 | Buller et al. |
| 2007/0249898 | A1 | 10/2007 | Otawara |
| 2007/0298590 | A1 | 12/2007 | Choi et al. |
| 2008/0047599 | A1 | 2/2008 | Buller et al. |
| 2008/0047603 | A1 | 2/2008 | Krasnov |
| 2008/0057220 | A1 | 3/2008 | Bachrach et al. |
| 2008/0110491 | A1 | 5/2008 | Buller et al. |
| 2008/0153280 | A1 | 6/2008 | Li et al. |
| 2008/0160661 | A1 | 7/2008 | Henley |
| 2008/0188033 | A1* | 8/2008 | Choi et al. ............ 438/96 |
| 2008/0223440 | A1 | 9/2008 | Sheng et al. |
| 2008/0264480 | A1 | 10/2008 | Choi et al. |
| 2009/0104733 | A1 | 4/2009 | Chae et al. |

FOREIGN PATENT DOCUMENTS

| | | |
|---|---|---|
| EP | 0 994 515 A2 | 4/2000 |
| EP | 1420081 | 5/2004 |
| EP | 1 650 811 | 4/2006 |
| JP | 4063735 | 2/1992 |
| JP | 4068043 | 3/1992 |
| JP | 10294482 | 4/1998 |
| JP | 10294481 | 11/1998 |
| JP | 11087742 | 3/1999 |
| JP | A H09-23 5915 | 3/1999 |
| JP | 1195795 | 7/1999 |
| JP | 11186574 | 7/1999 |
| JP | 11274535 | 10/1999 |
| JP | 2000/101107 | 4/2000 |
| JP | 2000133827 | 5/2000 |
| JP | 2000243704 | 9/2000 |
| JP | 2000252216 | 9/2000 |
| JP | 2000252484 | 9/2000 |
| JP | 2000252496 | 9/2000 |
| JP | 2001093842 | 4/2001 |
| JP | 2001093843 | 4/2001 |
| JP | 2001/168364 | 6/2001 |
| JP | 2001152347 | 6/2001 |
| JP | 2001155997 | 6/2001 |
| JP | 2001196310 | 7/2001 |
| JP | 2001/223170 | 8/2001 |
| JP | 2001/237189 | 8/2001 |
| JP | 2002/270517 | 9/2002 |
| JP | 2004/071716 | 3/2004 |
| JP | 2004/296652 | 10/2004 |
| JP | 2005-135986 | 5/2005 |
| JP | 2006/310694 | 11/2006 |
| JP | 2006-319068 | 11/2006 |
| JP | 2007/035914 | 2/2007 |
| JP | 2007/305826 | 11/2007 |
| JP | 2008/181965 | 8/2008 |
| KR | 20060067919 | 6/2006 |
| WO | WO 9526571 | 10/1995 |
| WO | WO 03/065462 | 8/2003 |
| WO | WO-03096080 | 11/2003 |
| WO | WO 2007/118252 | 10/2007 |
| WO | WO 2007 149945 | 12/2007 |

OTHER PUBLICATIONS

Office Action. U.S. Appl. No. 12/263,032. Dated Sep. 1, 2009.
Office Action. U.S. Appl. No. 11/624,677. Dated Sep. 16, 2009.
Rech et al. "Amorphous and Microcrystalline Silicon Solar Cells Prepared at High Deposition Rates Using RF (13.56MHz) Plasma Excitation Frequencies." Solar Energy Materials & Solar Cells 66 (2001), pp. 267-273.
Platz, et al. "H2-Dilution VS. Buffer Layers for Increased Voc." Insistut de Microtechnique, Universite de Neuchatel, Rue A-L. Breguet 2, CH-2000 Neuchatel, Switzerland.
D.Das, et al. "Characterization of Undoped μc-SiO:H films prepared from (SiH4+C02+H2)—plasma in RF glow discharge, Solar Energy Materials & Solar Cells 63" (2000), pp. 285-297.
A. Lambertz, et al. "Microcrystalline silicone oxide as intermediate reflector for thin film silicon solar cells", 22nd European Photovoltaic Solar Energy Conference, Sep. 3-7, 2007, Milan, Italy, pp. 1839-1842.
Buehlmann, et al. "In situ silicon oxide based intermediate reflector for thin-film silicon micromorph solar cells", Applied Physics Letters 91, 143505 (2007).
K. Yamamoto, et al. "A Thin-Film Silicon Solar Cell and Module, Progress in Photovoltaics: Research and Applications". 2005, 13, pp. 489-494.
O. Vetterl, et al "Preparation Temperature Effects in Microcrystalline Silicon Thin Film Solar Cells", Mat. Res. Soc. Symp. Proc. vol. 664 p. A 25.8.1-A 25.8.6, 2001.
Stefan Klein, et al. "Microcrystalline Silicon Prepared by Hot-Wire Chemical Vapor Deposition for Thin Film Solar Cell Applications", Jpn J. Appl. Phys. vol. 41(2002)pp. L 10-12, Jan. 2002.
S. Klein, et al "High Efficiency Thin Film Solar Cells with Intrinsic Microcrystalline Silicon Prepared by Hot Wire CVD" Mat. Res. Soc. Symp. Proc. vol. 715 @ 2002 Materials Research Society, pp. A26. 2.1-A 26.2.6.
Ujjwal K. Das et al "Amorphous and Microcrystalline silicon Solar Cells Grown by Pulsed PECVD Technique", Mat. Res. Soc. Symp. Proc. vol. 715 @ 2002 Materials Research Society pp. A. 26.6.1-A 26.6.6.
A. Vijh, et al.; Film Adhesion in Triple Junction a-Si Solar Cells on Polymide Substrates; 0-7803-8707-4/05 IEEE (2005).
Zhu, et al. "A Wide Band Gap Boron-doped Microcrystalline Silicon Film Obtained with VHF Glow Discharge Method," 2005.
Veprek, et al. "Properties of microcrystalline silicon. IV. Electrical conductivity, electron spin resonance and the effect of gas adsorption". Issue 32. Nov. 20, 1983.
"Hydrogenated amorphous silicon," Cambridge University Press 1991. pp. 344.
Shah, et al. "Microcrystalline Silicon and 'micromorph' tandem Solar Cells," Thin Solid Films 403-404 (2002). p. 179-187.
Vallat-Sauvain, et al. "Evolution of the Microstructure in Microcrystalline Silicon Prepared by Very High Frequency Glow-Discharge Using Hydrogen Dilution," Journal of Applied Physics. vol. 87, No. 6. Mar. 2000.
G. Willeke. "Physics and Electronic Properties of Microcrystalline Semiconductors." 1992 Artech House, Inc.
Schropp, et al. "Amorphous and Microcrystalline Solar Cells: Modeling, Materials and Device Technology," Kluwer Academic Publishers, 1998.
Meier, et al. "Thin-Film Silicon Cell Technology: Current and Near Future," Oerlikon Solar. Sep. 2008.

* cited by examiner

PLASMA TREATMENT BETWEEN DEPOSITION PROCESSES

CROSS-REFERENCE TO RELATED APPLICATIONS

This application claims benefit of U.S. Provisional Patent Application Ser. No. 60/985,194, filed Nov. 2, 2007, which is herein incorporated by reference.

BACKGROUND OF THE INVENTION

1. Field of the Invention

Embodiments of the present invention generally relate to solar cells and methods and apparatuses for forming the same. More particularly, embodiments of the present invention relate to thin film solar cells and methods and apparatuses for forming the same.

2. Description of the Related Art

Crystalline silicon solar cells and thin film solar cells are two types of solar cells. Crystalline silicon solar cells typically use either mono-crystalline substrates (i.e., single-crystal substrates of pure silicon) or a multi-crystalline silicon substrates (i.e., poly-crystalline or polysilicon). Additional film layers are deposited onto the silicon substrates to improve light capture, form the electrical circuits, and protect the devices. Thin-film solar cells use thin layers of materials deposited on suitable substrates to form one or more p-i-n junctions.

Problems with current thin film solar cells include low efficiency and high cost. Therefore, there is a need for improved thin film solar cells and methods and apparatuses for forming the same in a factory environment.

SUMMARY OF THE INVENTION

Embodiments of the present invention generally provide a method of forming a thin film solar cell, comprising transferring a substrate into a plasma enhanced chemical vapor deposition chamber, depositing an n-doped amorphous silicon layer over the substrate, providing a plasma treatment to the n-doped amorphous silicon layer disposed on the substrate, depositing an n-doped microcrystalline silicon layer over the n-doped amorphous silicon layer; and removing the substrate from the chamber.

Embodiment of the invention may further provide a method of forming a thin film solar cell, comprising transferring a substrate into a first plasma enhanced chemical vapor deposition chamber disposed in a first system, depositing a p-doped silicon layer over a surface of the substrate in the first plasma enhanced chemical vapor deposition chamber, transferring a substrate from the first plasma enhanced chemical vapor deposition chamber into a second plasma enhanced chemical vapor deposition chamber disposed in the first system, depositing an intrinsic amorphous silicon layer in the second plasma enhanced chemical vapor deposition chamber over the p-doped silicon layer, depositing an n-doped amorphous silicon layer over the intrinsic amorphous silicon layer, exposing the n-doped amorphous silicon layer to a plasma treatment, depositing an n-doped microcrystalline silicon layer over the n-doped amorphous silicon layer, and removing the substrate from the second plasma enhanced chemical vapor deposition chamber.

Embodiment of the invention may further provide a method of forming a thin film solar cell, comprising depositing an amorphous silicon layer over a surface of a transparent substrate, providing a plasma treatment to the amorphous silicon layer disposed on the transparent substrate, and depositing an microcrystalline silicon layer over the amorphous silicon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention include improved thin film solar cells and methods and apparatus for forming the same. For ease and clarity of description, the present invention will be described in reference to the tandem junction solar cell of FIG. 1 although the present invention may be used to advantage to form other single junction, tandem junction, or multi-junction solar cells.

Figure 1:
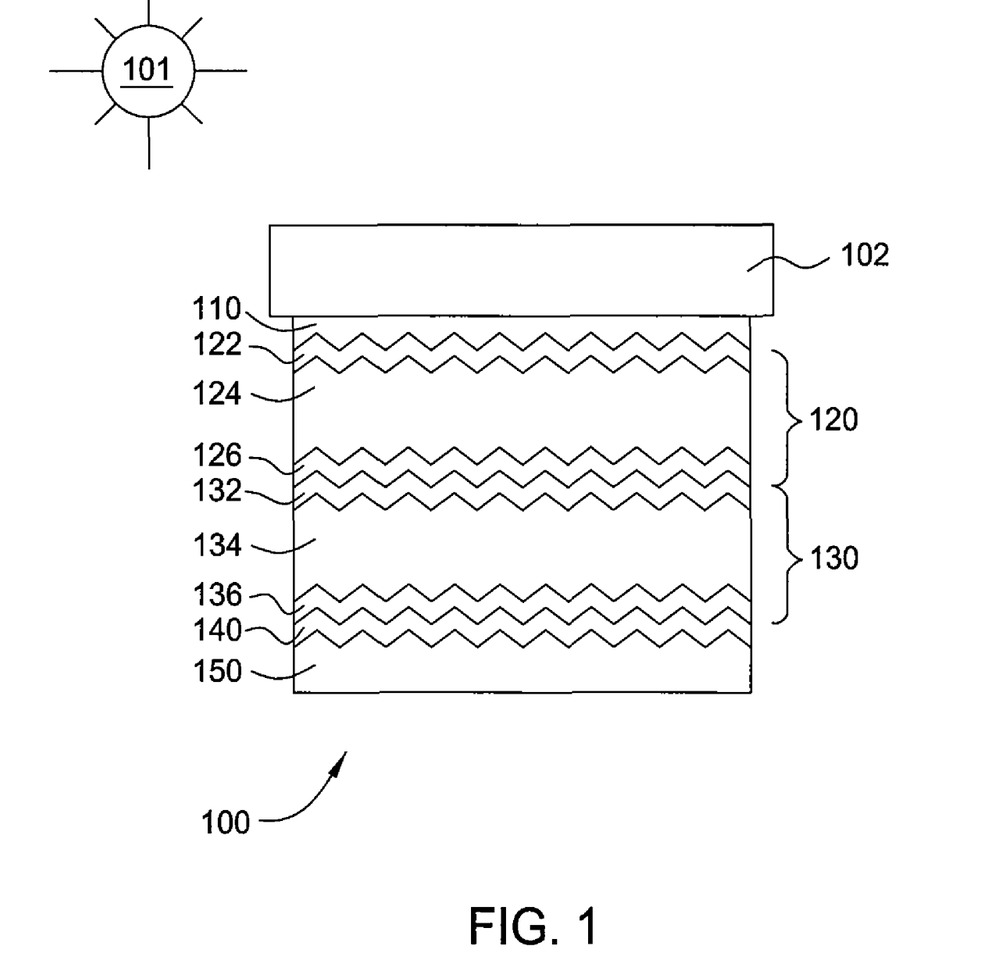
FIG. 1 is a schematic diagram of a multi-junction solar cell oriented toward the light or solar radiation according to one embodiment of the invention.

FIG. 1 is a schematic diagram of a multi-junction solar cell 100 oriented toward the light or solar radiation 101. Solar cell 100 comprises a substrate 102, such as a glass substrate, polymer substrate, or other suitable transparent substrate, with thin films formed thereover. The solar cell 100 further comprises a first transparent conducting oxide (TCO) layer 110 formed over the substrate 102, a first p-i-n junction 120 formed over the first TCO layer 110, a second p-i-n junction 130 formed over the first p-i-n junction 120, a second TCO layer 140 formed over the second p-i-n junction 130, and a metal back layer 150 formed over the second TCO layer 140. To improve light absorption by reducing light reflection, the substrate and/or one or more of thin films formed thereover may be optionally textured by wet, plasma, ion, and/or mechanical processes. For example, in the embodiment shown in FIG. 1, the first TCO layer 110 is textured and the subsequent thin films deposited thereover will generally follow the topography of the surface below it.

The first TCO layer 110 and the second TCO layer 140 may each comprise tin oxide, zinc oxide, indium tin oxide, cadmium stannate, doped materials thereof combinations thereof, or other suitable materials. It is understood that the TCO materials may also include additional dopants and components. For example, zinc oxide may further include dopants, such as aluminum, gallium, boron, and other suitable dopants. Zinc oxide preferably comprises 5 atomic % or less of dopants, and more preferably comprises 2.5 atomic % or less aluminum. For example, tin oxide may further include dopants such as fluorine. In certain instances, the substrate 102 may be provided by the glass manufacturers with the first TCO layer 110 already provided.

The first p-i-n junction 120 comprises a p-doped silicon layer 122, an intrinsic silicon layer 124, and an n-doped silicon layer 126. The second p-i-n junction 130 comprises a p-doped silicon layer 132, an intrinsic silicon layer 134, and an n-doped silicon layer 136. In certain embodiments, the intrinsic silicon layer 124 of the first p-i-n junction 120 comprises an amorphous silicon layer whereas the intrinsic silicon layer 134 of the second p-i-n junction 130 comprises a microcrystalline silicon layer since the amorphous silicon intrinsic layer and the microcrystalline silicon intrinsic layer absorb different regions of the solar spectrum. In one embodiment, the p-doped silicon layer 122, the intrinsic silicon layer 124, and the n-doped silicon layer 126 are each formed from an amorphous silicon containing layer. In one embodiment, the p-doped silicon layer 132 and the intrinsic silicon layer 134 are each formed from a microcrystalline silicon containing layer, and the n-doped silicon layer 136 is formed from an amorphous silicon containing layer. It is believed that using an n-type amorphous silicon layer 136 over a p-doped microcrystalline silicon layer 132 and the intrinsic microcrystalline silicon layer 134 in the second p-i-n junction 130 provides increased cell efficiency since the n-type amorphous silicon layer 136 is more resistant to attack from oxygen, such as the oxygen in air. Oxygen may attack the silicon films and thus forming impurities which lower the capability of the films to participate in electron/hole transport therethrough. It is also believed that the lower electrical resistivity of an amorphous silicon layer versus a crystalline silicon layer in the formed solar cell structure/device will have improved electrical properties due to the reduced affect of unwanted shunt paths on the power generation in the formed second p-i-n junction 130. Shunt paths, which generally extend vertically through the formed p-i-n layers, degrade the solar cells performance by shorting out local lateral regions of the formed solar cell device. Therefore, since the lateral resistance of the amorphous n-type layer (i.e., perpendicular to the vertical direction) is much higher than a crystalline layer the lower the affect that a shunt type defect will have on the rest of the formed solar cell. The reduction in the affect of shunt type defects will improve the solar cell's device performance.

Figure 2:
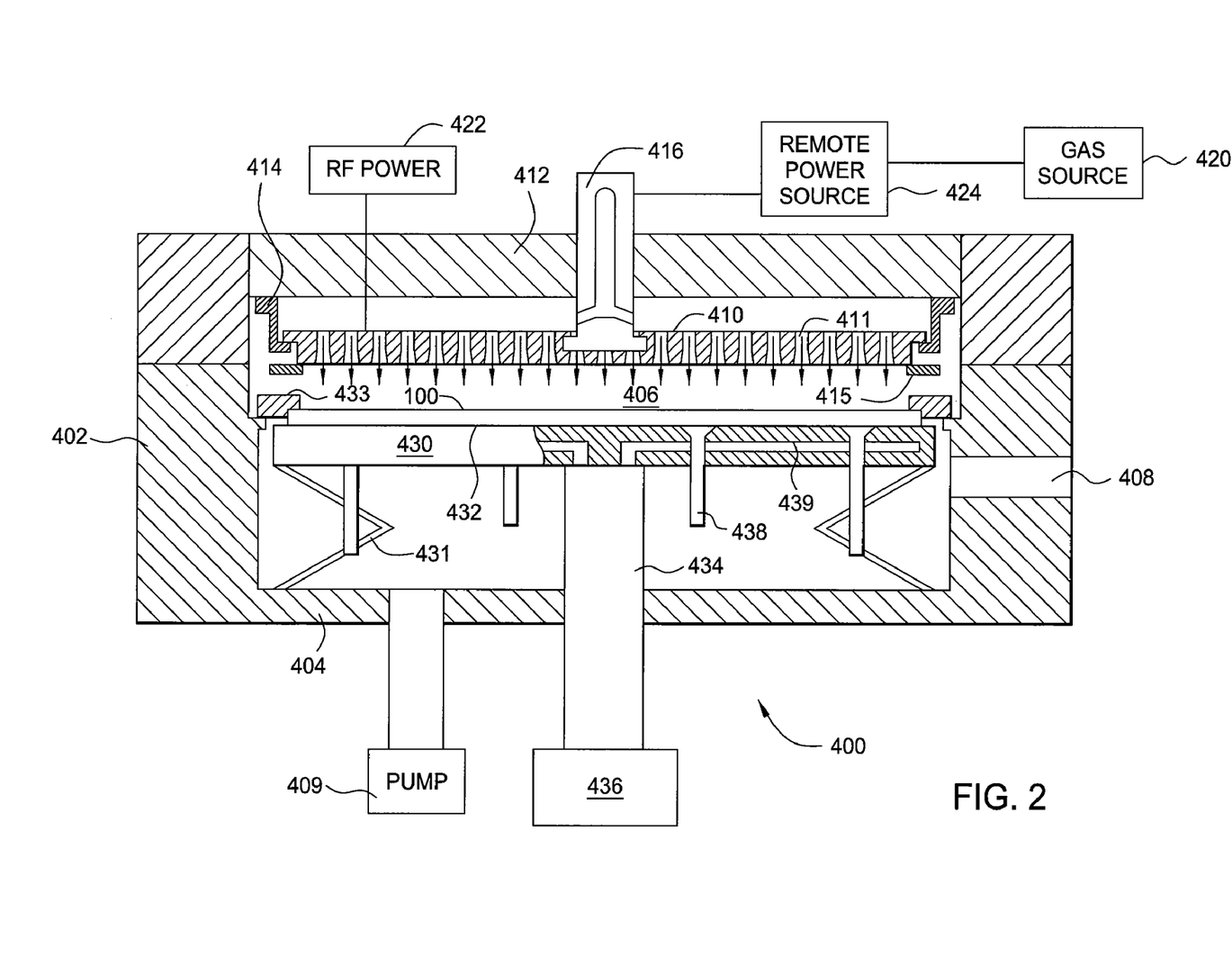
FIG. 2 is a schematic cross-section view of one embodiment of a plasma enhanced chemical vapor deposition (PECVD) chamber.

FIG. 2 is a schematic cross-section view of one embodiment of a plasma enhanced chemical vapor deposition (PECVD) chamber 400 in which one or more films of a solar cell, such as one or more silicon layers of the first p-i-n junction 120 and/or the second p-i-n junction 130 of the solar cell 100 of FIG. 1, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 400 generally includes walls 402, a bottom 404, and a showerhead 410, and substrate support 430 which define a process volume 406. The process volume is accessed through a valve 408 such that the substrate, such as substrate 102, may be transferred in and out of the chamber 400. The substrate support 430 includes a substrate receiving surface 432 for supporting a substrate and stem 434 coupled to a lift system 436 to raise and lower the substrate support 430. A shadow from 433 may be optionally placed over periphery of the substrate 102. Lift pins 438 are moveably disposed through the substrate support 430 to move a substrate to and from the substrate receiving surface 432. The substrate support 430 may also include heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. A gas source 420 is coupled to the backing plate 412 to provide gas through the backing plate 412 and through the holes 411 formed in showerhead 410 to the substrate receiving surface 432. A vacuum pump 409 is coupled to the chamber 400 to control the process volume 406 at a desired pressure. An RF power source 422 is coupled to the backing plate 412 and/or to the showerhead 410 to provide a RF power to the showerhead 410 so that an electric field is created between the showerhead and the substrate support so that a plasma may be generated from the gases between the showerhead 410 and the substrate support 430. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure.

A remote plasma source 424, such as an inductively coupled remote plasma source, may also be coupled between the gas source and the backing plate. Between processing substrates, a cleaning gas may be provided to the remote plasma source 424 so that a remote plasma is generated and provided to clean chamber components. The cleaning gas may be further excited by the RF power source 422 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al, which is incorporated by reference to the extent not inconsistent with the present disclosure.

In one embodiment, the heating and/or cooling elements 439 may be set to provide a substrate support temperature during deposition of about 400 degrees Celsius or less, preferably between about 100 degrees Celsius and about 400 degrees Celsius, more preferably between about 150 degrees Celsius and about 300 degrees Celsius, such as about 200 degrees Celsius.

For deposition of silicon films, a silicon-based gas and a hydrogen-based gas are provided. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. Suitable hydrogen-based gases include, but are not limited to hydrogen gas ($H_2$). The p-type dopants of the p-type silicon layers may each comprise a group III element, such as boron or aluminum. Preferably, boron is used as the p-type dopant. Examples of boron-containing sources include trimethylboron (TMB (or $B(CH_3)_3$)), diborane ($B_2H_6$), $BF_3$, $B(C_2H_5)_3$, and similar compounds. Preferably, TMB is used as the p-type dopant. The n-type dopants of the n-type silicon layer may each comprise a group V element, such as phosphorus, arsenic, or antimony. Preferably, phosphorus is used as the n-type dopant. Examples of phosphorus-containing sources include phosphine and similar compounds. The dopants are typically provided with a carrier gas, such as hydrogen, argon, helium, and other suitable compounds. In the process regimes disclosed herein, a total flow rate of hydrogen gas is provided. Therefore, if a hydrogen gas is provided as the carrier gas, such as for the dopant, the carrier gas flow rate should be subtracted from the total flow rate of hydrogen to determine how much additional hydrogen gas should be provided to the chamber.

Figure 3A:
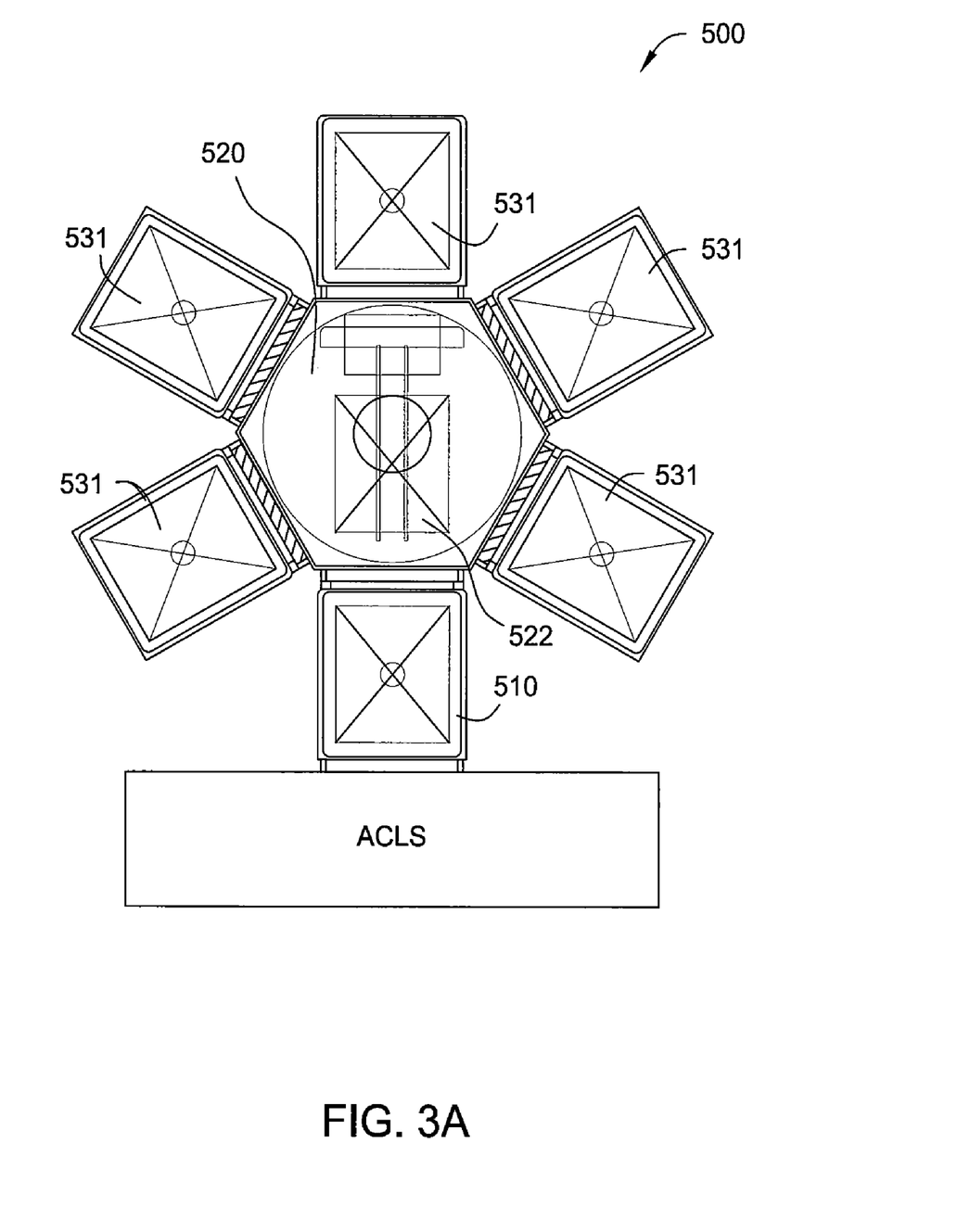
FIG. 3A is a plan schematic view of a processing system according to one embodiment of the invention.
Figure 3B:
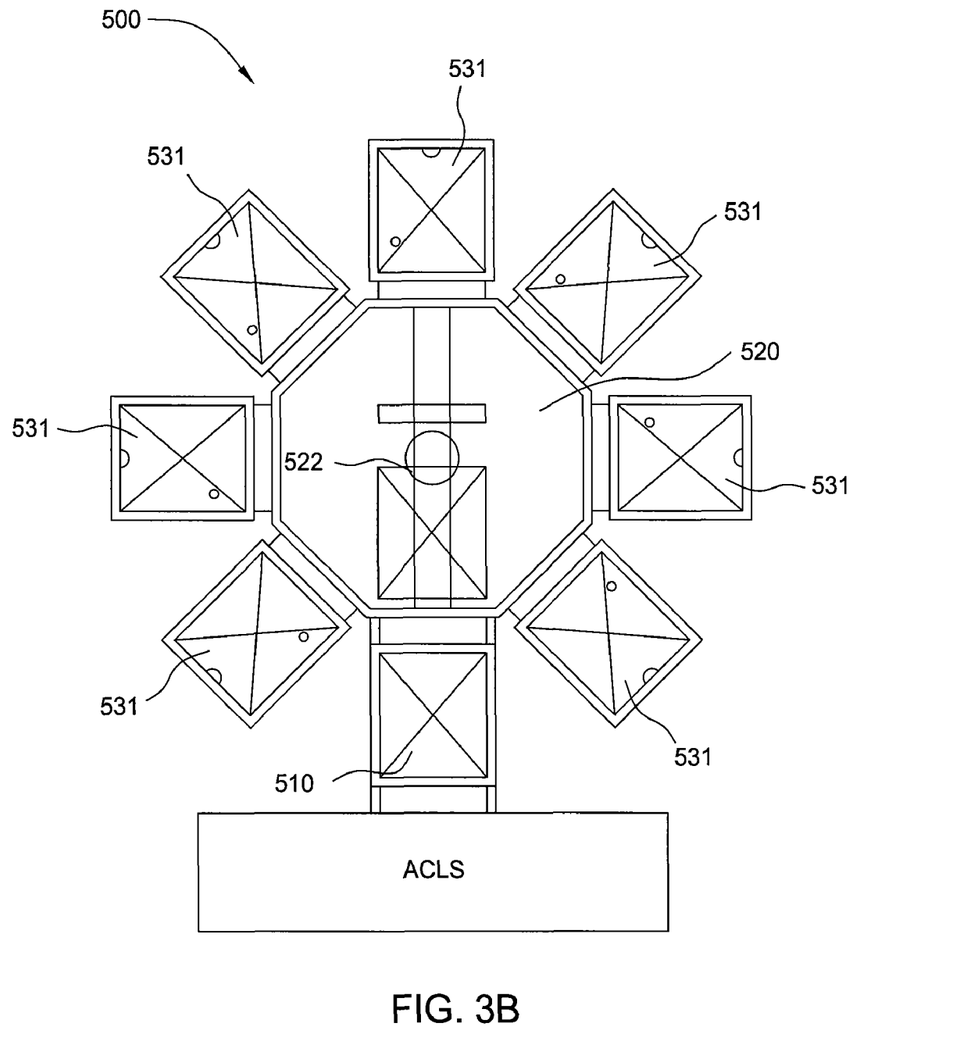
FIG. 3B is a plan schematic view of a processing system according to one embodiment of the invention.

FIG. 3A and FIG. 3B are schematic plan views of embodiments of a process system, or system 500, having a plurality of process chambers 531, such as PECVD chambers chamber 400 of FIG. 2 or other suitable chambers capable of depositing silicon films. The system 500 includes a transfer chamber 520 coupled to a load lock chamber 510 and the process chambers 531. The load lock chamber 510 allows substrates to be transferred between the ambient environment outside the system and vacuum environment within the transfer chamber 520 and process chambers 531. The load lock chamber 510 includes one or more evacuatable regions holding one or more substrate. The evacuatable regions are pumped down during input of substrates into the system 500 and are vented during output of the substrates from the system 500. The transfer chamber 520 has at least one vacuum robot 522 disposed therein that is adapted to transfer substrates between the load lock chamber 510 and the process chambers 531. Five process chambers are shown in FIG. 3A and seven process chambers are shown in FIG. 3B; however, the system may have any suitable number of process chambers.

In certain embodiments of the invention, one system 500 is configured to form at least one p-i-n junction, such as at least one of the p-i-n junctions of FIG. 1. At least one of process chambers 531 is configured to deposit a p-doped silicon layer and at least one of the process chambers 531 is configured to deposit an n-doped silicon layer. In certain aspects it may be advantageous to deposit p-doped silicon layers and n-doped silicon layers in separate process chambers to reduce the chance of contamination from the different dopants. In one embodiment, the intrinsic silicon layer may be deposited in a separate process chamber from the p-doped and n-doped silicon process chambers. However, to increase throughput, the intrinsic silicon layer may be deposited in the same chamber as p-doped silicon deposition or as the same chamber as n-doped silicon deposition.

Figure 4:
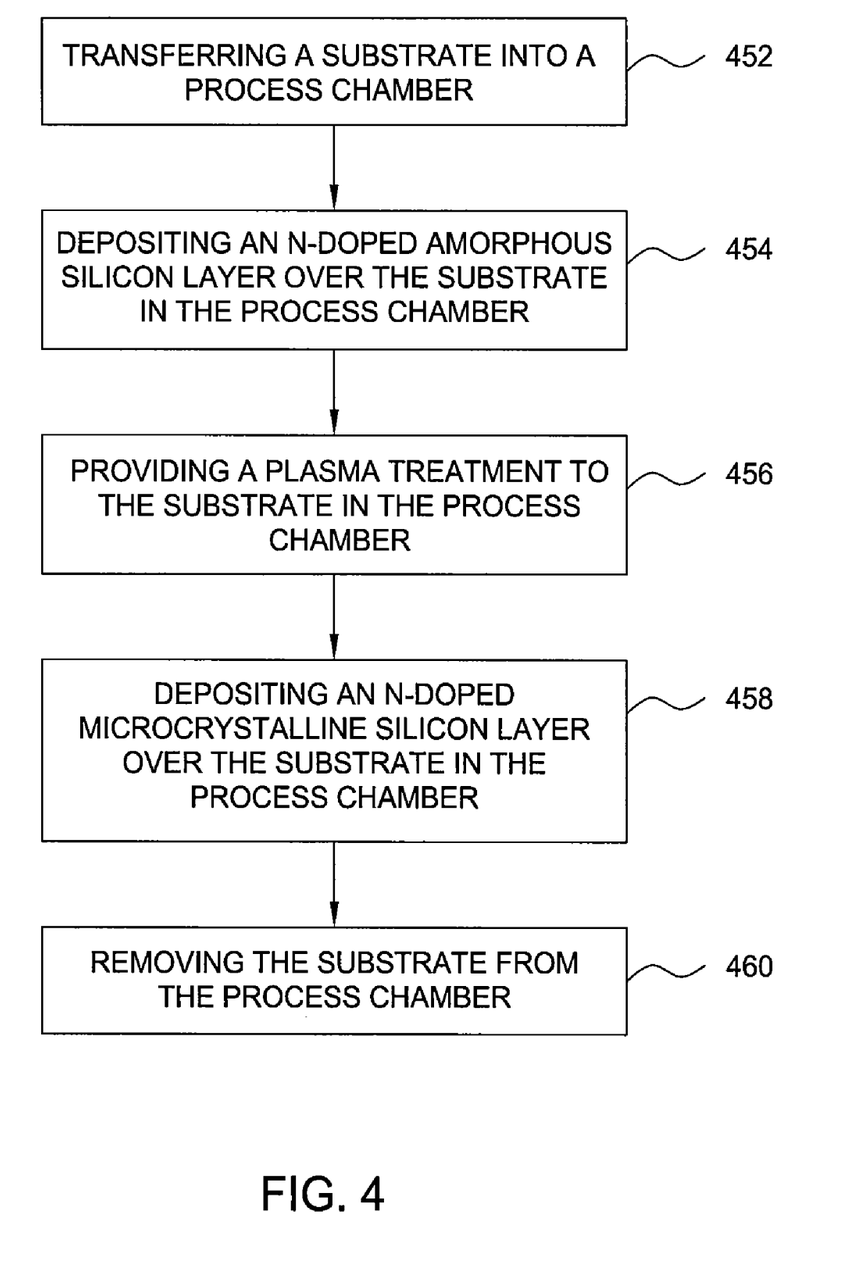
FIG. 4 is a flow chart of one embodiment of forming a p-i-n junction according to one embodiment of the invention.

FIG. 4 is a flow chart of one embodiment of providing a plasma treatment in forming a solar cell. In step 452, a substrate is transferred into a PECVD process chamber, such as one of the process chambers 531 of systems 500 of FIG. 3A or FIG. 3B. In step 454, an n-doped amorphous silicon layer is deposited over the substrate. In step 456, a plasma treatment is provided to the substrate, which is discussed below. The plasma treatment preferably comprises a hydrogen plasma. Other suitable plasmas may also be used. In step 458, an n-doped microcrystalline layer is deposited over the substrate. In step 460, the substrate is removed from the PECVD process chamber.

Not wishing to be bound by theory unless explicitly set forth in the claims, it is believed that a plasma treatment over an n-doped amorphous silicon layer helps to improve deposition of an n-doped microcrystalline silicon layer thereover. In one theory, it is believed that the plasma treatment helps to convert at least a portion of the n-doped amorphous silicon layer into n-doped microcrystalline silicon. This n-doped microcrystalline silicon acts as a seed layer improving n-doped microcrystalline silicon deposition thereon. In another theory, it is believed that a hydrogen plasma treatment creates a hydrogen-rich surface over the substrate improving formation of the later deposited n-doped microcrystalline silicon thereover.

In one embodiment, the n-doped silicon layer 136 comprises a first bottom cell n-doped amorphous silicon layer and a second bottom cell n-doped silicon layer. In certain embodiments, the first bottom cell n-doped amorphous semiconductor layer may be formed to a thickness between about 100 Å and about 400 Å. In certain embodiments, second bottom cell n-doped silicon layer may be formed from a degenerately doped layer (e.g., $n^{++}$-type layer) to a thickness between about 50 Å and about 150 Å. In one embodiment, the second bottom cell n-doped silicon layer is an n-type microcrystalline layer. In another embodiment, the second bottom cell n-doped silicon layer is an n-type amorphous layer. Therefore, in one embodiment, when forming the bottom cell 130, a process step similar to step 456 may be performed after depositing the first bottom cell n-doped amorphous silicon layer, but prior to depositing the second bottom cell n-doped silicon layer.

Figure 5:
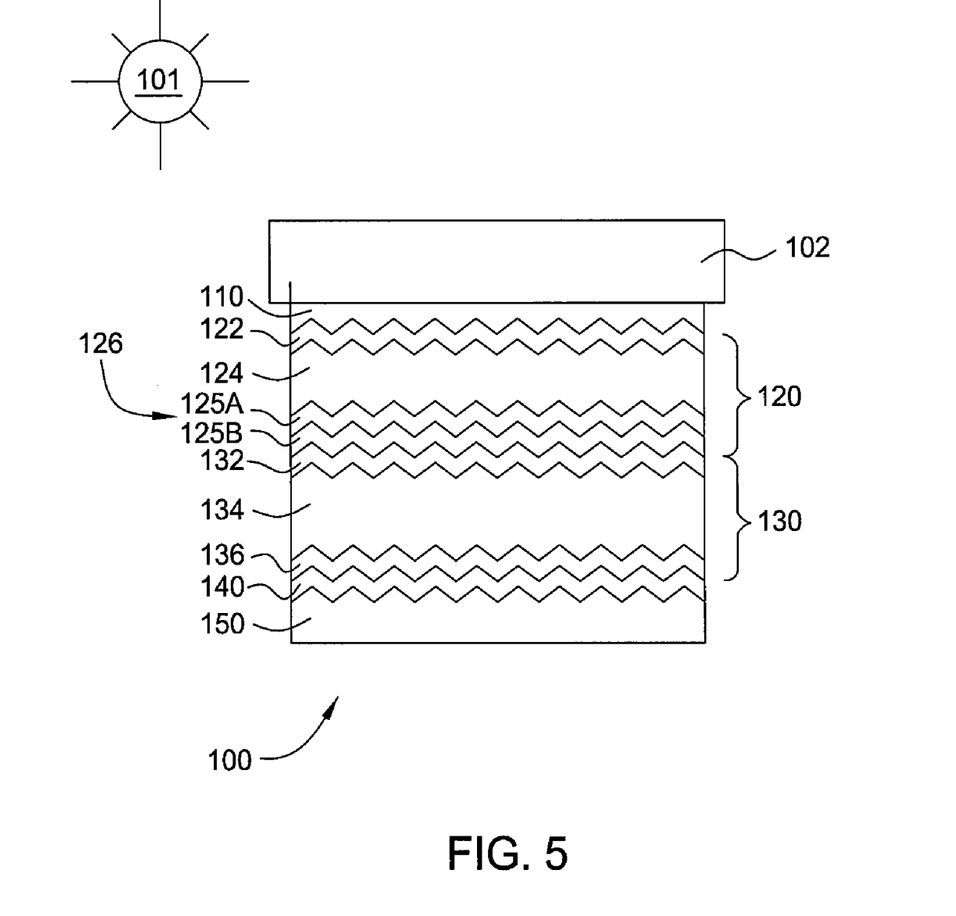
FIG. 5 is a schematic diagram of a multi-junction solar cell oriented toward the light or solar radiation according to one embodiment of the invention.

The process of FIG. 4 may be applied to the formation of an n-doped silicon layer 126 in the tandem cell of FIG. 1 in which the intrinsic silicon layer 124 comprises amorphous silicon and the intrinsic silicon layer 134 comprises microcrystalline silicon. The n-doped silicon layer 126 is formed by depositing an n-doped amorphous silicon layer, plasma treating the n-doped amorphous silicon layer, and then by depositing an n-doped microcrystalline silicon layer thereon. In certain embodiments, as illustrated in FIG. 5, the n-doped silicon layer 126 comprises an n-doped amorphous silicon layer 125A formed to a thickness between about 10 Å and about 200 Å and an n-type microcrystalline layer 125B formed to a thickness between about 100 Å and about 400 Å. In one embodiments, as illustrated in FIG. 5, the n-doped silicon layer 126 comprises an n-doped amorphous silicon layer 125A formed to a thickness between about 30 Å and about 50 Å and an n-type microcrystalline layer 125B formed to a thickness between about 250 Å and about 400 Å. Not wishing to be bound by theory, unless set forth in the claims, the n-doped amorphous silicon layer is believed to help bridge the bandgap offset that is believed to exist between the amorphous type intrinsic silicon layer 124 and the n-doped microcrystalline silicon layer. Thus it is believed that cell efficiency is improved due to enhanced current collection.

Certain embodiments of depositing an n-doped amorphous silicon layer comprise providing hydrogen gas to silicon gas in a ratio of about 20:1 or less. Hydrogen gas may be provided at a flow rate between about 4 sccm/L and about 50 sccm/L. Phosphine may be provided at a flow rate between about 0.0005 sccm/L and about 0.0075 sccm/L. In other words, if phosphine is provided in a 0.5% molar or volume concentration in a carrier gas, then the dopant/carrier gas mixture may be provided at a flow rate between about 0.1 sccm/L and about 1.5 sccm/L. Silane gas may be provided at a flow rate between about 1 sccm/L and about 10 sccm/L. The flow rates in the present disclosure are expressed as sccm per interior chamber volume. The interior chamber volume is defined as the volume of the interior of the chamber in which a gas can occupy. For example, the interior chamber volume of chamber 400 of FIG. 2 is the volume defined by the backing plate 412 and by the walls 402 and bottom 404 of the chamber minus the volume occupied therein by the showerhead assembly (i.e., including the showerhead 410, suspension 414, center support 415) and by the substrate support assembly (i.e., substrate support 430, grounding straps 431). An RF power between about 50 milliWatts/cm$^2$ and about 250 milliWatts/cm$^2$ may be provided to the showerhead. The RF powers in the present disclosure are expressed as Watts supplied to an electrode per substrate area. For example, for a RF power of 10,385 Watts supplied to a showerhead to process a substrate having dimensions of 220 cm×260 cm, the RF power would be 10,385 Watts/(220 cm ×260 cm)=180 milliWatts/cm$^2$. The pressure of the chamber may be maintained between about 0.1 Torr and 20 Torr, preferably between about 0.5 Torr and about 4 Torr. The spacing during deposition between the top surface of a substrate disposed on the substrate receiving surface 432 and the showerhead 410 may be between 400 mil (i.e., thousands of an inch) and about 1,200 mil, preferably between 400 mil and about 800 mil. The deposition rate of the n-type amorphous silicon buffer layer may be about 200 Å/min or more.

Certain embodiments of a plasma treatment process (e.g., step 456) comprise providing a hydrogen (H$_2$) gas at a flow rate between about 5 sccm/L and 100 sccm/L. In certain embodiments, the plasma treatment process comprise providing a hydrogen (H$_2$) gas at a flow rate between about 5 sccm/L and 100 sccm/L. In another embodiment, the plasma treatment process comprises providing helium (He), carbon dioxide (CO$_2$), argon (Ar), and/or other similar gas at a similar mass flow rate. An RF power between 10 milliWatts/cm$^2$ and about 250 milliWatts/cm$^2$ may be provided to the showerhead during the plasma treatment process. The pressure of the chamber during the plasma treatment process may be maintained between about 1 Torr and about 100 Torr, preferably between about 3 Torr and about 20 Torr, more preferably between 4 Torr and about 12 Torr. The spacing between the top surface of a substrate disposed on the substrate receiving surface 432 and the showerhead 410 may be between about 400 mil (10.2 mm) and about 1,200 mil (30.4 mm), preferably between 400 mil (10.2 mm) and about 800 mil (20.4 mm) during the plasma treatment process. Not wishing to be bound by theory unless explicitly set forth in the claims, it is believed that the plasma treatment process is useful, since the process provides an increased number of nucleation sites for the n-doped microcrystalline layer to form on the treated n-doped amorphous silicon layer, due to the change in the surface morphology (e.g., roughness) created by the plasma bombardment of the n-doped amorphous silicon layer during processing. The improved in film morphology and increase the number nucleation sites can thus improve the n-doped amorphous silicon layer's properties and reduce the time required to form the n-doped microcrystalline layer of a desired thickness.

While the discussion herein, mainly discusses providing a plasma treatment process between the deposition of an n-doped amorphous silicon layer and an n-doped microcrystalline layer this process configuration is not intended to limiting as to the scope of the invention described herein. It is thus noted that prior to each of the deposition steps for each of the layers in the first p-i-n junction 120 and the second p-i-n junction 130, including n-type, intrinsic type and p-type silicon containing layers, an optional plasma treatment process may be performed. As noted above the plasma treatment is believed to be especially advantageous when used between an amorphous layer deposition step and a microcrystalline layer deposition step to promote nucleation of the microcrystalline layer.

Certain embodiments of depositing an n-doped microcrystalline silicon layer may comprise providing a gas mixture of hydrogen gas to silane gas in a ratio of about 100:1 or more. Silane gas may be provided at a flow rate between about 0.1 sccm/L and about 0.8 sccm/L. Hydrogen gas may be provided at a flow rate between about 30 sccm/L and about 250 sccm/L. Phosphine may be provided at a flow rate between about 0.0005 sccm/L and about 0.004 sccm/L. In other words, if phosphine is provided in a 0.5% molar or volume concentration in a carrier gas, then the dopant/carrier gas may be provided at a flow rate between about 0.1 sccm/L and about 0.8 sccm/L. An RF power between about 100 milliWatts/cm$^2$ and about 900 milliWatts/cm$^2$ may be provided to the showerhead. The pressure of the chamber may be maintained between about 1 Torr and about 100 Torr, preferably between about 3 Torr and about 20 Torr, more preferably between 4 Torr and about 12 Torr. The deposition rate of the n-type microcrystalline silicon layer may be about 50 Å/min or more. The n-type microcrystalline silicon layer has a crystalline fraction between about 20 percent and about 80 percent, preferably between 50 percent and about 70 percent.

Examples of various processing steps that may be adapted to form one or more of the layers described herein to form a tandem solar cell may be found in the pending U.S. patent application Ser. No. 11/671,988 filed Feb. 6, 2007, entitled "Multi-Junction Solar Cells and Methods and Apparatuses for Forming the Same", the pending U.S. patent application Ser. No. 12/178,289 filed Jul. 23, 2008, entitled "Multi-Junction Solar Cells and Methods and Apparatuses for Forming the Same," and the pending U.S. patent application Ser. No. 11/426,127 filed Jun. 23, 2006, entitled "Methods and Apparatus for Depositing a Microcrystalline Silicon Film for Photovoltaic Device," which are all incorporated by reference in their entirety to the extent not inconsistent with the present disclosure.

Referring back to FIGS. 3A-3B, in one embodiment of the system 500, one of the process chambers 531 is configured to deposit the p-type silicon layer(s) in the first p-i-n junction 120 or the second p-i-n junction 130 of a solar cell device, another one of the process chambers 531 is configured to deposit an intrinsic silicon layer of the first or the second p-i-n junction, and another of the process chambers 531 is configured to deposit the n-type silicon layer(s) of the first or the second p-i-n junction. As noted above, while a three chamber process configuration may have some contamination control advantages, it will generally have a lower substrate throughput than a two chamber processing system, and generally cannot maintain a desirable throughput when one or more of the processing chambers is brought down for maintenance.

In certain embodiments of the invention, the system 500 (e.g., FIG. 3A or FIG. 3B) is configured to form at least one of the p-i-n junctions, such as the first p-i-n junction 120 or the second p-i-n junction 130 illustrated in FIGS. 1 or 5. In one embodiment, one of the process chambers 531 is configured to deposit the p-type silicon layer(s) of the first p-i-n junction 120 while the remaining process chambers 531 are each configured to deposit both the intrinsic type silicon layer(s), and the n-doped silicon layers of the first p-i-n junction 120. In one embodiment, the intrinsic type silicon layer(s) and the n-type silicon layers of the first p-i-n junction 120 or the second p-i-n junction 130 may be deposited in the same chamber without performing a seasoning process (e.g., intrinsic type layer deposited on the chamber walls) in between steps, which is used to minimize cross-contamination between the deposited layers, in between the deposition steps. While the discussion of the system 500 and its components references its use in forming the various elements of the first p-i-n junction 120 this configuration is not intended to be limiting as to the scope of the invention described herein, since the system 500 could be adapted to form the first p-i-n junction, the second p-i-n junction, both the first and second p-i-n junctions, or other combinations thereof without deviating from the basic scope of the invention described herein.

In one example, in which the substrate processing sequence performed in a system configured similarly to the system 500, a substrate enters the system 500 through the load lock chamber 510, the substrate is then transferred by the vacuum robot 522 into the process chamber 531 that is configured to deposit a p-type silicon layer(s) on the substrate, after depositing the p-type layer in process chamber 531 the substrate is then transferred by the vacuum robot 522 into another of the process chambers 531 that is configured to deposit both the intrinsic type silicon layer(s) and the n-type silicon layers, and then after depositing the intrinsic-type layer(s) and n-type layers the substrate is returned to the load lock chamber 510 after which the substrate can be removed from the system. A continuous series of substrates can be loaded and maneuvered by the vacuum robot 522 from a process chamber that is adapted to deposit a p-type layer and then transfer each of the substrates to at least one subsequent processing chamber to form the i-n layers. In one embodiment, the first p-i-n junction 120 is formed in one system 500 and the second p-i-n junction 130 is formed in another system 500. In one case, a vacuum break, or exposure to ambient atmospheric conditions (e.g., air), will occur between the formation of the first p-i-n junction 120 and the second p-i-n junction 130 in different systems.

In a two chamber processing configuration, subsequent to deposition of the i-n layers in each of the chambers dedicated to producing the same, the process may be repeated. However, to preclude contamination being incorporated into the intrinsic layers formed on subsequent substrates, it has been found that performing a cleaning process, such as a seasoning process in each of the chambers dedicated to producing the i-n layers at some desired interval the device yield of the processing sequence can be improved. The seasoning process may generally comprises one or more steps that are used to remove prior deposited material from a processing chamber part and one or more steps that are used to deposit a material on the processing chamber part as discussed in accordance with one of the embodiments described herein. An example of a seasoning process and solar cell processing sequence that may be used is further described in the U.S. patent application Ser. No. 12/170,387, filed Jul. 9, 2008, which is herein incorporated by reference.

While the foregoing is directed to embodiments of the present invention, other and further embodiments of the invention may be devised without departing from the basic scope thereof, and the scope thereof is determined by the claims that follow.

The invention claimed is:

1. A method of forming a thin film solar cell, comprising:
    transferring a substrate into a plasma enhanced chemical vapor deposition chamber;
    depositing an n-doped amorphous silicon layer over the substrate;
    providing a plasma treatment to the n-doped amorphous silicon layer disposed on the substrate;
    depositing an n-doped microcrystalline silicon layer over the n-doped amorphous silicon layer;
    removing the substrate from the chamber; and
    forming a p-i-n junction over the n-doped microcrystalline silicon layer, wherein forming the p-i-n junction comprises:
        depositing a p-doped microcrystalline silicon layer over the n-doped microcrystalline silicon layer;
        depositing an n-doped amorphous silicon layer over the p-doped silicon layer; and
        depositing an intrinsic microcrystalline silicon layer between the p-doped microcrystalline silicon layer and the n-doped amorphous silicon layer.

2. The method of claim 1, wherein providing a plasma treatment comprises generating a plasma using a hydrogen gas.

3. The method of claim 1, wherein the intrinsic microcrystalline silicon layer has a thickness of greater than about 1,000 Å.

4. The method of claim 1, wherein the p-doped microcrystalline layer is deposited on the surface of the deposited n-doped microcrystalline silicon layer.

5. A method of forming a thin film solar cell, comprising:
    transferring a substrate into a first plasma enhanced chemical vapor deposition chamber disposed in a first system;
    depositing a p-doped silicon layer over a surface of the substrate in the first plasma enhanced chemical vapor deposition chamber;
    transferring a substrate from the first plasma enhanced chemical vapor deposition chamber into a second plasma enhanced chemical vapor deposition chamber disposed in the first system;
    depositing an intrinsic amorphous silicon layer in the second plasma enhanced chemical vapor deposition chamber over the p-doped silicon layer;
    depositing an n-doped amorphous silicon layer over the intrinsic amorphous silicon layer;
    exposing the n-doped amorphous silicon layer to a plasma treatment;
    depositing an n-doped microcrystalline silicon layer over the n-doped amorphous silicon layer;
    removing the substrate from the second plasma enhanced chemical vapor deposition chamber; and
    forming a p-i-n junction over the n-doped microcrystalline silicon layer, wherein forming the p-i-n junction comprises:
        depositing a p-doped microcrystalline silicon layer over the n-doped microcrystalline silicon layer;
        depositing an n-doped amorphous silicon layer over the p-doped silicon layer; and
        depositing an intrinsic microcrystalline silicon layer between the p-doped microcrystalline silicon layer and the n-doped amorphous silicon layer.

6. The method of claim 5, wherein exposing the n-doped amorphous silicon layer to a plasma treatment plasma treatment comprises generating plasma using a hydrogen gas.

7. The method of claim 5, further comprising transferring the substrate from the second plasma enhanced chemical vapor deposition chamber in the first system to a first plasma enhanced chemical vapor deposition chamber disposed in a second system before depositing a p-doped microcrystalline silicon layer over the n-doped microcrystalline silicon layer.

8. A method of forming a thin film solar cell, comprising:
    depositing an amorphous silicon layer over a surface of a transparent substrate;
    providing a plasma treatment to the amorphous silicon layer disposed on the transparent substrate;
    depositing an microcrystalline silicon layer over the amorphous silicon layer; and
    forming a p-i-n junction over the microcrystalline silicon layer, wherein forming the p-i-n junction comprises:
        depositing a p-doped microcrystalline silicon layer over the n-doped microcrystalline silicon layer;

depositing an n-doped amorphous silicon layer over the p-doped silicon layer; and depositing an intrinsic microcrystalline silicon layer between the p-doped microcrystalline silicon layer and the n-doped amorphous silicon layer.

9. The method of claim 8, wherein providing a plasma treatment comprises providing a gas selected from the group consisting of hydrogen, helium, argon and carbon dioxide.

10. The method of claim 8, further comprising depositing a transparent conductive oxide layer on the surface of the transparent substrate before depositing the amorphous silicon layer.

11. The method of claim 8, wherein depositing the n-doped amorphous silicon layer further comprises:

depositing a first n-doped layer on the intrinsic microcrystalline silicon layer; and depositing a second n-doped amorphous layer on the first n-doped layer, wherein the second n-doped amorphous layer is degenerately doped.

12. The method of claim 1, wherein depositing the n-doped amorphous silicon layer further comprises:

depositing a first n-doped layer on the intrinsic microcrystalline silicon layer; and depositing a second n-doped amorphous layer on the first n-doped layer.

13. The method of claim 5, wherein depositing the n-doped amorphous silicon layer further comprises:

depositing a first n-doped layer on the intrinsic microcrystalline silicon layer; and depositing a second n-doped amorphous layer on the first n-doped layer.

14. The method of claim 1, further comprising:

transferring the substrate into a second plasma enhanced chemical vapor deposition chamber, wherein depositing the p-doped microcrystalline silicon layer over the n-doped microcrystalline silicon layer is performed in the second plasma enhanced chemical vapor deposition chamber; and transferring the substrate into a third plasma enhanced chemical vapor deposition chamber, wherein depositing the n-doped amorphous silicon layer and depositing the intrinsic microcrystalline silicon layer is performed in the third plasma enhanced chemical vapor deposition chamber.

15. The method of claim 5, further comprising:

transferring the substrate into a third plasma enhanced chemical vapor deposition chamber disposed in a second system, wherein depositing the p-doped microcrystalline silicon layer over the n-doped microcrystalline silicon layer is performed in the third plasma enhanced chemical vapor deposition chamber; and transferring the substrate from the third plasma enhanced chemical vapor deposition chamber into a fourth plasma enhanced chemical vapor deposition chamber disposed in the second system, wherein depositing the n-doped amorphous silicon layer and depositing the intrinsic microcrystalline silicon layer is performed in the fourth plasma enhanced chemical vapor deposition chamber.

\* \* \* \* \*